United States Patent [19]

Fehn et al.

[11] Patent Number: 4,707,664
[45] Date of Patent: Nov. 17, 1987

[54] QD MRI RE COIL USING NON-HOMOGENEOUS AND NON-UNIFORM RF FIELD DISTRIBUTION

[75] Inventors: John H. Fehn, El Sobrante; Mitsuaki Arakawa, Hillsborough; Barry M. McCarten, Piedmont, all of Calif.

[73] Assignee: The Regents of the University of California, Berkeley, Calif.

[21] Appl. No.: 878,369

[22] Filed: Jun. 25, 1986

[51] Int. Cl.⁴ ............................................. G01R 33/20
[52] U.S. Cl. .................................... 324/322; 324/318; 324/307; 128/653
[58] Field of Search ............... 324/307, 309, 316, 318, 324/322; 128/653

[56] References Cited

U.S. PATENT DOCUMENTS

| 4,648,405 | 3/1987 | Keren | 324/309 |
| 4,652,827 | 3/1987 | Eguchi et al. | 324/322 |

FOREIGN PATENT DOCUMENTS 2151791 7/1985 United Kingdom .................. 34/307

OTHER PUBLICATIONS

"Quadrature Detection Coils-A Further√2̄ Improvement in Sensitivity" by Chen et al, J. Mag. Res. 54, 324–327 (1983).
"Quadrature Detection in the Laboratory Frame" by Hoult et al, Mag. Res. Med., 1, 339–353 (1984).
"A Quadrature Probe for Adult Head NMR Imaging" by Sank et al, Department of Radiology, NIH, pp. 650–651.
"Radio Frequency Penetration Effects in MR Imaging: Simulation/Experiment with Linearly Polarized and Circularly Polarized RF Fields" by Glover et al, GE Medical Systems, pp. 264–265.
"An In Vivo NMR Probe Circuit for Improved Sensitivity" by Murphy-Boesch et al, J. Mag. Res. 54, 526–532 (1983).

Primary Examiner—Stewart J. Levy
Assistant Examiner—Kevin D. O'Shea
Attorney, Agent, or Firm—Nixon & Vanderhye

[57] ABSTRACT

A pair of co-located RF surface coils extend axially and part-circumferentially about a volume to be imaged. Because surface coils are employed, the RF field distribution will be non-symmetric, non-homogeneous and non-uniform within the volume. Nevertheless, if the two coils are rotationally offset by the proper amount (and possibly including capactive isolation coupling therebetween), the coils produce a pair of RF signals to/from the volume which are in quadrature phase thus providing signal-to-noise ratio improvements due to: (a) the fact that quadrature detection techniques are employed and (b) the fact that only a portion of the cross-sectional volume is effectively addressed by the surface coils (i.e., due to their non-symmetric, non-homogeneous and non-uniform field distribution).

12 Claims, 8 Drawing Figures

QD MRI RE COIL USING NON-HOMOGENEOUS AND NON-UNIFORM RF FIELD DISTRIBUTION

This invention is related to the field of magnetic resonance imaging (MRI) utilizing nuclear magnetic resonance (NMR) phenomena. It is particularly related to an advantageous quadrature-detection (QD) RF "surface" coil for such an apparatus.

This application is generally related to earlier filed, commonly assigned, patents and applications of Crooks et al including U.S. Pat. Nos. 4,297,637; 4,318,043; 4,471,305; 4,599,565; Crooks 4,607,225 (now allowed); the pending application to Crooks Ser. No. 515,116 filed July 19, 1983; the pending application to Arakawa et al Ser. No. 827,609 filed Feb. 10, 1986; (now allowed) Harrison et al U.S. Pat. No. 4,682,125; and the copending concurrently filed application to Arakawa et al Ser. No. 888,074. The contents of these referenced related patents and/or patent applications will be of background interest to those in the art.

Magnetic resonance imaging (MRI) is now coming into wide-spread commercial usage. Nevertheless, there are still many possible areas for improvement. For example, desired improvements are still sought to improve the signal-to-noise ratio in NMR responses and, accordingly, in resulting NMR images.

One previously known technique for improving the attainable signal-to-noise ratio involves the use of quadrature RF transmit/receive coils. For example, a general description of such quadrature RF coils and of the potential benefits to be derived from use of same is provided in the following prior publications:

"Quadrature Detection Coils - A Further $\sqrt{2}$ Improvement in Sensitivity" by Chen et al, J. Mag. Res. 54, 324–327 (1983).

"Quadrature Detection in the Laboratory Frame" by Hoult et al, Mag. Res. Med. 1 339–353 (1984).

"A Quadrature Probe For Adult Head NMR Imaging" by Sank et al, Department of Radiology, NIH, pp 650–651.

"Radio Frequency Penetration Effects in MR Imaging: Simulation/Experiment with Linearly Polarized and Circularly Polarized RF Fields" by Glover et al, GE Medical Systems, pp 264–265.

(The above-referenced Arakawa et al application Ser. No. 827,609 also specifically relates to a quadrature RF coil for MRI.)

These prior publications describe a pair of matched quadrature RF coils wherein each coil includes four axially extending legs disposed at 60°, 120°, 60° and 120° intervals about a common cylinder—with one coil being rotated 90° spatially with respect to the other. The quadrature phase outputs from these two separate coils are subsequently combined in a 90° hybrid so as to produce an output having increased signal-to-noise ratio (e.g., because the non-coherent noise will tend to cancel when the two signals are coherently added with an appropriate 90° phase shift in one of them). As is also noted in these references, one or both of the coils may be advantageously utilized for transmitting RF NMR excitation pulses into the enclosed volume to be imaged so as to further enhance the attainable signal-to-noise ratio and/or so as to reduce the required level of transmitted RF power.

Ideally, there should be no inductive coupling between the two RF quadrature coils. In reality, there is always inherently some spurious coupling. Nevertheless, the effective isolation between the two coils can be improved by purposefully adding some additional coupling between the coils of the proper amplitude and phase to cancel (or at least substantially reduce) the unwanted but inherent spurious inter-coil coupling. It is apparently for this purpose that the prior art has employed conductive areas (termed "paddles") between some sections of the coil legs.

Although the general theory of quadrature detection coils is known in the prior art, the successful realization of a commercially reproducible working embodiment of such a system with minimum coupling between the coils, an RF balanced coil structure—and one which is nevertheless configured spatially in a manner which facilitates not only manufacture but actual use—remains as a difficult task.

Some prior approaches have employed coil structures having both ends of the coil structure open-ended and with axially extending feedlines emanating from opposite ends of the overall structure and respectively associated with each of the two coils.

The earlier-referenced related Arakawa et al application Ser. No. 827,609 discloses an improved and novel structure for a QD MRI RF coil arrangement which provides very good isolation between the two coils even though only one end of the coil is open-ended (e.g., so as to accept a head or other object to be imaged) while the other end of the structure is "closed" for convenient location of RF coupling and feeding structures. This novel arrangement includes a special perpendicular arrangement of respectively associated RF feedline structures extending across perpendicular diameters of the common closed end. Pairs of coil legs in each of the coil structures are capacitively coupled together at the open end and conductively coupled together at the closed end (where they are conductively coupled to a respectively associated one of the perpendicular feedline structures).

Where it is desired to image only a portion of an object located relatively close to its surface, so-called "surface" RF coils have also been employed in the prior art. In their simplest form, "surface" RF coils for MRI may simply comprise a loop of wire (or other conductive medium) disposed adjacent the skin or other surface area of the object for which an image is desired of structure located relatively near the surface. Such surface coils may be utilized, at least in part, so as to avoid RF coupling to other internal areas of the volume for which an image is not required. In this manner, possible sources of noise (e.g., motion artifact) associated with other more remote internal regions of the object are avoided and the effective signal-to-noise ratio can be improved for the volume actually of interest (e.g., located closer to one surface).

Since "surface" coils by their very nature do not completely and symmetrically encompass the volume being imaged, it follows that the RF field distribution in the imaged area is of a non-symmetric non-homogeneous and non-uniform nature. Ordinarily, this would be viewed as naturally inconsistent with the achievement of quadrature detection techniques. However, we have discovered that it is possible to simultaneously enjoy the advantages of surface coils and quadrature detection techniques. (As those in the art will appreciate, although the name "quadrature detection" maybe more directly associated with the receiving function of the coil, the coil is actually a reciprocal device and similar advantages are also achieved when the coil is used in a transmitting mode.)

In particular, we have discovered that it is possible to utilize a pair of surface coils which extend axially and part-circumferentially about a volume to be imaged but which are rotationally offset with respect to one another so as to produce a pair of RF signals to/from the volume which are in phase quadrature—even though the RF fields produced by each coil are non-symmetric non-homogeneous and non-uniform within the volume.

In the exemplary embodiment, each of the surface coil structures extend axially and part-circumferentially about the volume to be imaged and include a pair of axially extending conductive legs which are circumferentially spaced apart by an angle $\beta$ which is substantially less than 180° (hence constituting a "surface" coil which produces non-symmetric non-homogeneous and non-uniform fields within the encompassed volume. The distal ends of these axially extending legs are respectively interconnected by circumferentially extending conductors so as to complete the coil structure. In the exemplary embodiment, each of the axially extending legs includes a break in conductivity located midway along the leg a capacitive coupling disposed thereacross. (The "center-fed" aspect of this embodiment constitute the invention of Arakawa et al as described and claimed in the above-referenced related concurrently filed application (UC-86-045-1)).

In the exemplary embodiment, each of the two surface coils subtends an arc of approximately 120° degrees and the two surface coils are rotationally displaced with respect to one another by approximately 100° (e.g., to the disposition which minimizes inherent inductive coupling between the two surface coils). In addition, an isolating capacitive coupling may be connected between predetermined portions of the surface coils (e.g., portions having currents which are substantially 180° out-of-phase) so as to further increase the effective isolation between the two coils and thus enhance the available quadrature detection effect.

In the exemplary embodiment, each of the RF surface coil structures is mounted on a non-conductive substrate which is formed to define at least part of a cylinder surface (e.g., of approximately 15" diameter and of approximately 15" axial length) on which the coil is formed (having a similar diameter and an axial length of about 10"). One of substrates is mechanically captured by the other and slidably rotatable with respect to it so as to permit rotational adjustments. However, for a given coil design, it may not be necessary to maintain rotational adjustment to minimize inter-coil coupling.

These as well as other objects and advantages of this invention will be more completely understood and appreciated by carefully reading the following detailed description of a presently preferred exemplary embodiment when taken in conjunction with the accompanying drawings, of which:

Figure 7:
Figure 8:

FIG. 7 is a photograph of a quadrature detection magnetic resonance image illustrating the fact that effective RF coupling has been limited to only a portion of the volume relatively near one of the object surfaces; and FIG. 8 is a photograph of a magnetic resonance image similar to FIG. 7 but, for comparison purposes, made using a quadrature detection "full-body" coil structure which effectively couples to the entire cross-sectional volume.

Figure 1:
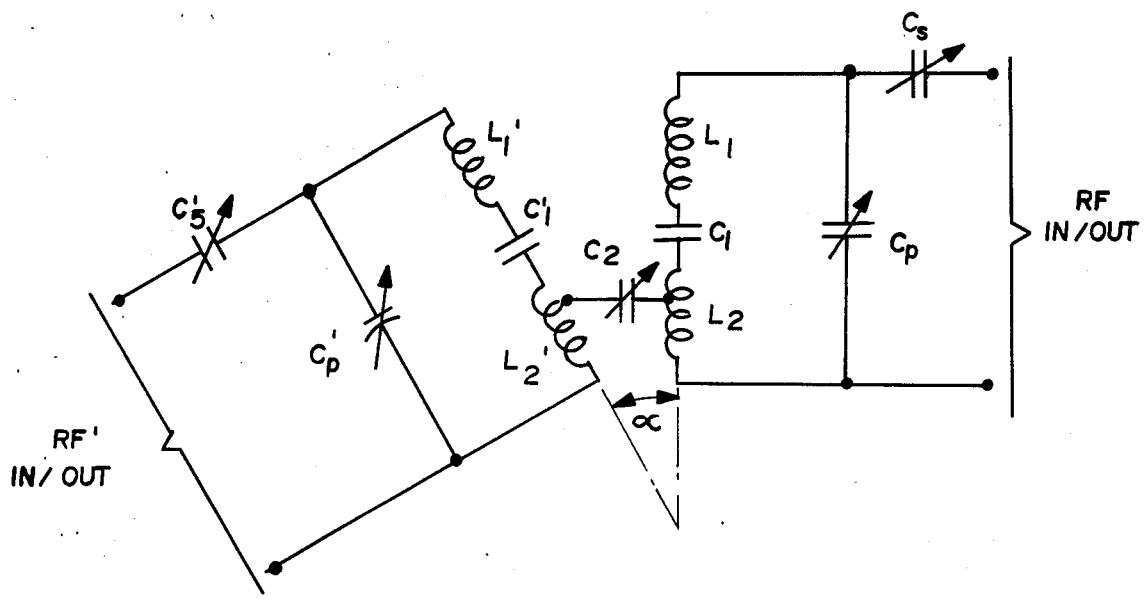
FIG. 1 is a schematic lumped parameter circuit diagram of an exemplary quadrature detection MRI RF coil structure in accordance with this invention.

The lumped-parameter circuit model for an MRI RF coil is, in and of itself, well-known and by now conventional as depicted in FIG. 1. For example, inductive portions of the coil (e.g., L1 and L2) may be capactively coupled (e.g., by C1) and tuned with a parallel tuning capacitance (e.g., $C_p$) and coupled to external RF circuits via one or more series capacitances (e.g., $C_s$). Although a balanced pair of series coupling capacitances $C_s$ may be used, such is not necessary in the exemplary embodiment due to use of a "ground breaker" structure described in the above-referenced related application of Harrison, et al, Ser. No. 827,638.

As also depicted in FIG. 1, the second coil has a similar schematic circuit where similar elements are denoted by like symbols but having an added prime notation. The two separate coil structures are relatively rotated with respect to each other by an angle $\alpha$ as depicted at FIG. 1 so as to achieve maximum coupling isolation (e.g., minimum inductive coupling) between the two coil structures. Even further isolation may be achieved by the use of an appropriately dimensioned and connected isolation coupling capacitor $C_2$ as will be appreciated by those in the art.

Figure 2:
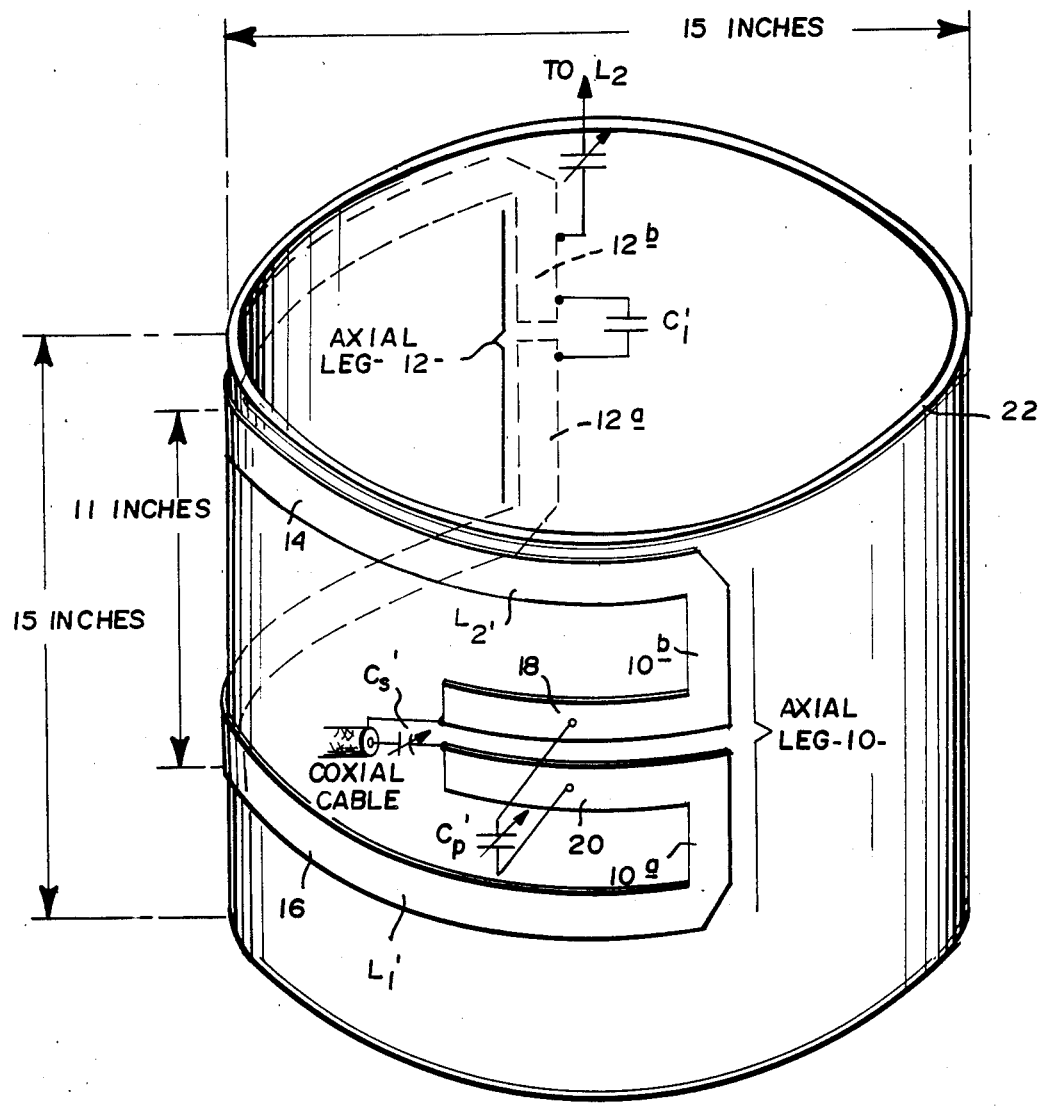
FIG. 2 is a simplified perspective mechanical depiction of the conductive segments L1' and L2' included in one of the surface coil structures.

As shown in FIG. 2, each of the surface coils in the exemplary embodiment include axially extending legs 10 (comprising sub-elements 10a and 10b) and 12 (comprising sub-elements 12a and 12b) with distal ends being respectively interconnected by circumferentially extending conductors 14 and 16. Reference symbols corresponding to the lumped parameter model of FIG. 1 are employed in FIG. 2 to show like elements. It will be noted that each axially-extending leg 10, 12 includes a conductive break midway along the length of the leg which is bridged across by coupling capacitance. Additionally, the break in leg 10 includes short circumferential inner-bridges or stubs 18, 20 which are provided for achieving a center fed arrangement (in accordance with the invention described and claimed in the above-referenced related concurrently filed application to Arakawa et al (UC 86-045-1). The inner-bridges 18, 20 also povide for convenience in mounting the physical structures which comprise parallel tuning capacitance $C_p$ and variable series coupling capacitance $C_s$ (all of which are more completely depicted in FIGS. 4–6).

In the exemplary embodiment, the conductive portions of the coil structure are formed from approximately 1 inch wide copper foil adhesively affixed to a cylindrical dielectric substrate 22. The axially extending legs 10, 12 in the exemplary embodiment subtend an angle of approximately 120° (although it is believed that this angle may be advantageously reduced to an angle on the order of approximately 90°). In any event, the axially extending legs are circumferentially spaced apart by an angle $\beta$ which is substantially less than 180° and which can therefore be expected to produce substantially non-symmetric non-homogeneous, and non-uniform RF fields within the included volume of cylinder 22. As previously explained, such non-symmetric fields are often advantageous when one wants to focus upon some particular area of interest (e.g., the aorta in a human body) while excluding surrounding tissue from the viewed field and thereby exluding possible extraneous noise sources and increasing the effective signal-to-noise ratio quality of the magnetic resonance image. For example, motion artifact may be effectively blocked by "sculpting" the shape of the RF field used for coupling RF MRI signals into and out of the body area of interest.

Figure 3:
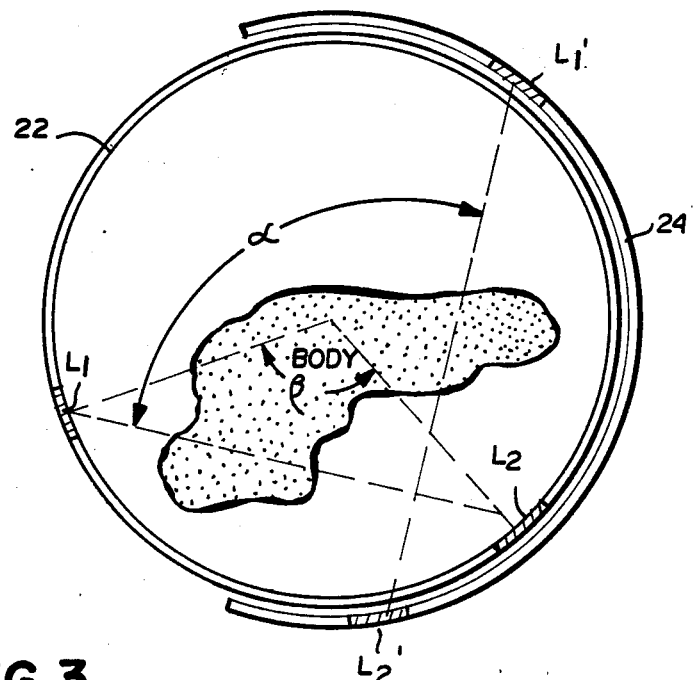
FIG. 3 is a cross-sectional schematic view of an assembled exemplary quadrature detection coil in accordance with this invention and illustrating the circumferential angle subtended by each individual surface coil structure as well as the relative angular displacement between the two surface coils.

Another coil substantially identical to the surface coil of FIG. 2 may be mounted to a similar cylindrical substrate 24 as depicted in FIGS. 3–6. Although the cylinder 24 is partially cut away in the exemplary embodiment, it physically subtends more than 180° so as to mechanically "capture" cylinder 22 therewithin while yet permitting relative rotational adjustment and therefore permitting relative sliding rotational movements between the two surface coil structures comprising L1', L2' on the one hand (mounted to substrate 22) and L1, L2 on the other hand (mounted to substrate 24). As best seen in FIG. 3, each of the surface coils subtends an angle $\beta$ which is substantially less than 180° and the two surface coil structures are, in turn, disposed at a relative rotational angle of $\alpha$. In the exemplary embodiment, $\beta$ is approximately 120° (which may be advantageously reduced to something on the order of 90° as previously mentioned) while angle $\alpha$ is approximately 100°.

In operation, natural inherent inductive coupling between the coils is minimized by adjusting angle $\alpha$ for minimum coupling (i.e., maximum isolation) at the RF frequency of interest. While this may provide sufficient isolation for some applications, in the exemplary embodiment, additional isolation is achieved by connecting isolation capacitor $C_2$ between portions of the L2 and L2' axially extending legs and then adjusting the value of this capacitance so as to achieve even further isolation between the two coils.

In the exemplary embodiment, the total inductance for one coil L1 plus L2 is equal to approximately 0.68 microhenries while coupling capacitance $C_1$ is approximately 370 picofarads. Parallel capacitance $C_p$ comprises an approximately 200 picofarad fixed capacitor in parallel with an approximately 150 picofarad variable capacitor and the series capacitance $C_s$ is a variable capacitance of approximately 150 picofarads.

Figure 4:
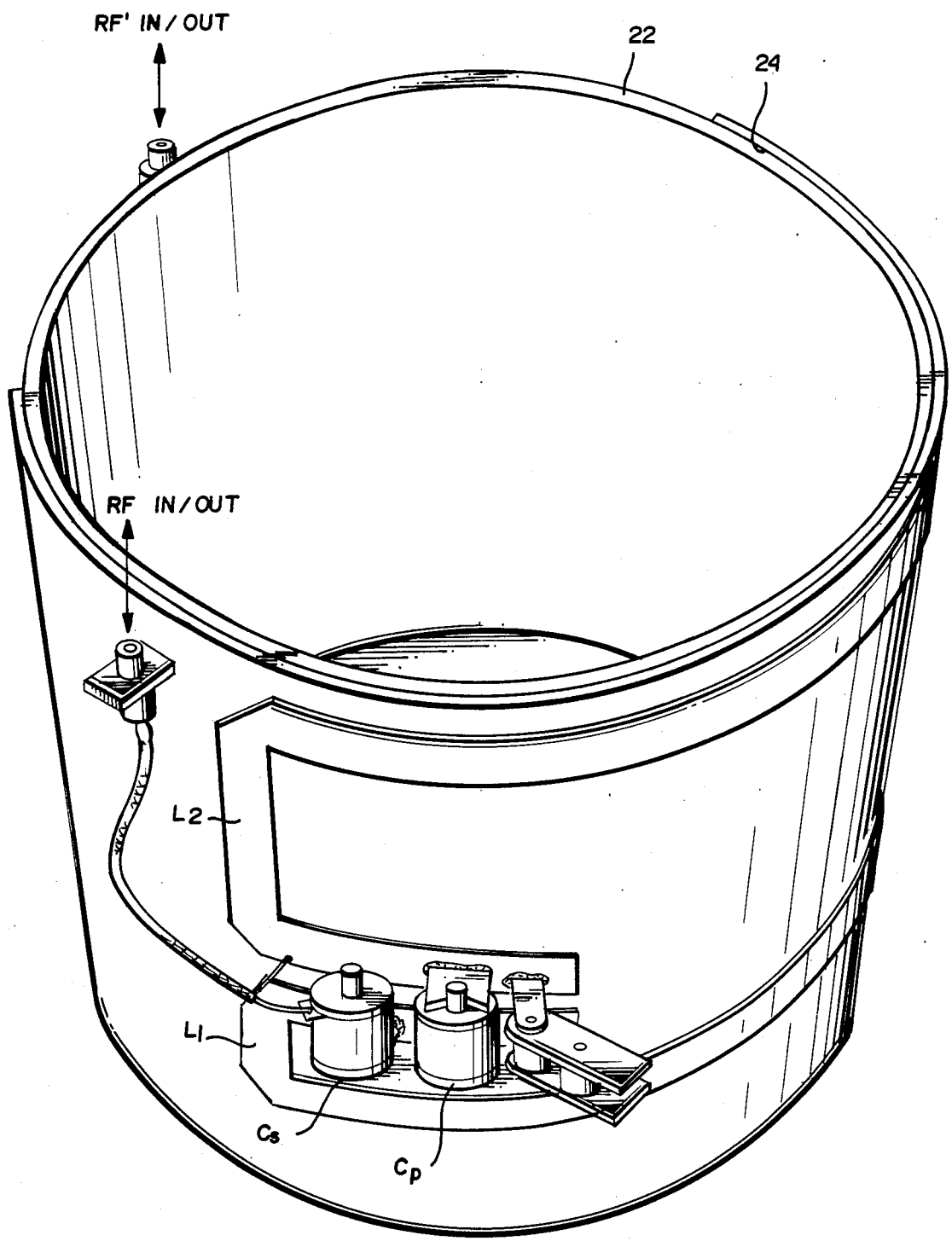
FIG. 4 is a perspective side-view of the exemplary embodiment.
Figure 5:
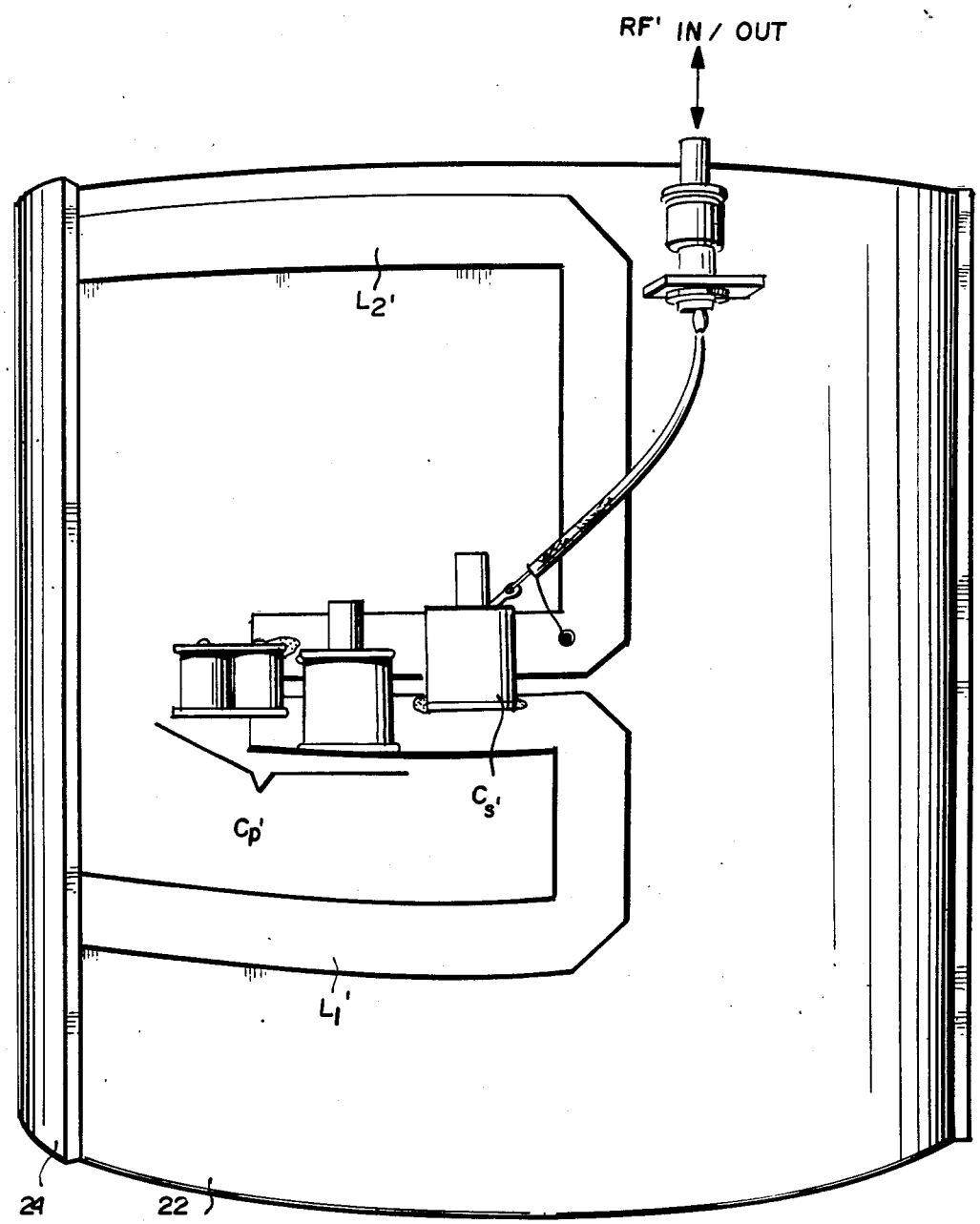
FIG. 5 is similar to FIG. 4 but viewed from the opposite side.
Figure 6:
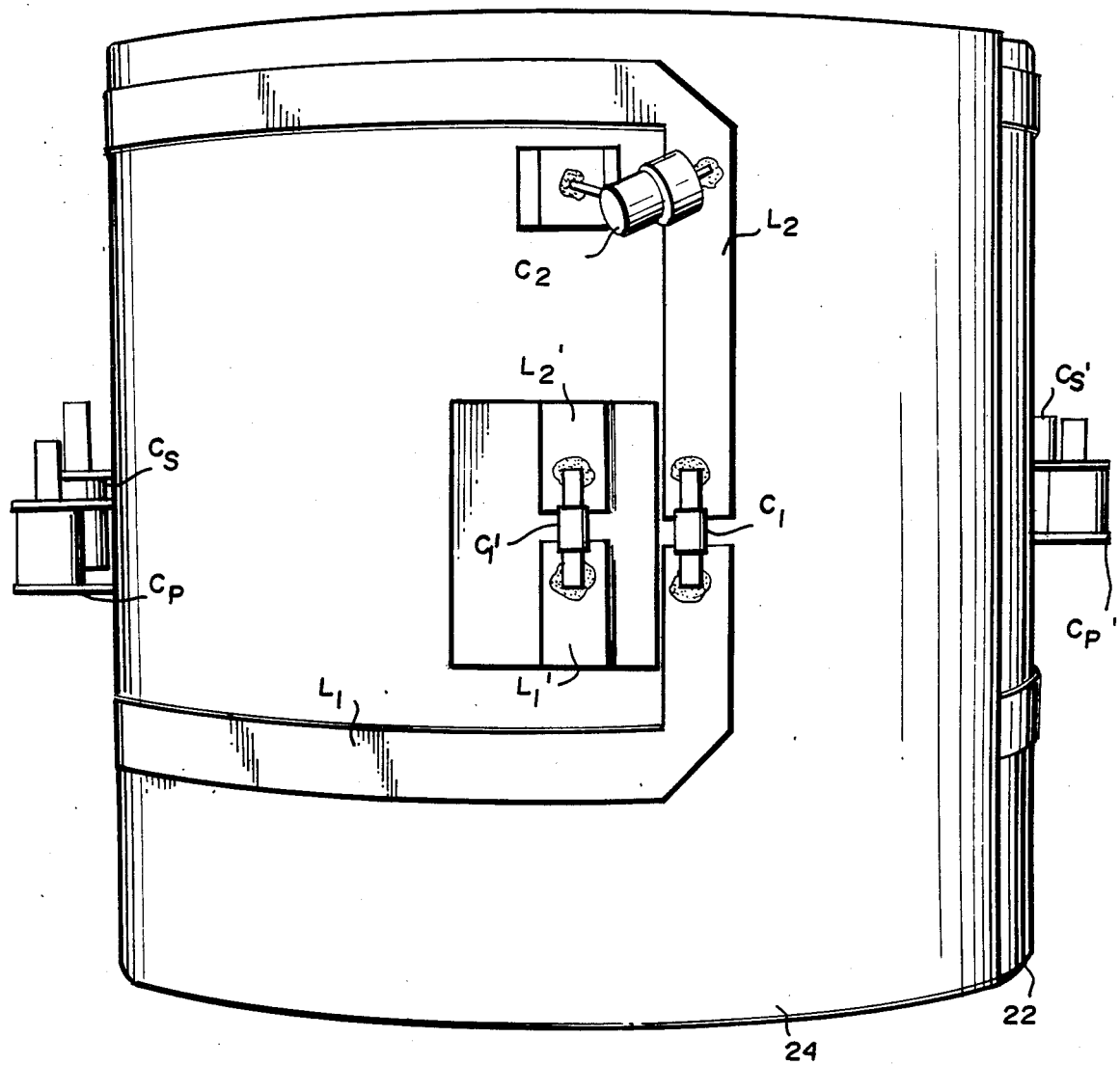
FIG. 6 is a perspective view of an intermediate portion of the structure shown in FIGS. 4 and 5 so as to illustrate the overlapped region of the surface coils.

FIGS. 4–6 are perspective views of an exemplary embodiment having reference numbers as already described with respect to FIGS. 1–3 and which are therefore now believed to be substantially self-explanatory in view of the already given description of these earlier figures.

A conventional QD body coil magnetic resonance image as depicted in FIG. 8 illustrates the manner in which this type of coil couples to substantially the entire cross-section of a human body and thus necessarily includes many sources of motion artifact or other noise sources. When only a portion of such cross-section is actually of interest, there are advantages in signal-to-noise ratio achieved through the use of surface coil coupling so as to effectively couple the MRI apparatus only to the region of interest. A QD surface coil image achieved using a coil in accordance with this invention is depicted in FIG. 7. As should now be appreciated, in addition to the increased signal-to-noise ratio achieved by use of surface coils, an additional increase in signal-to-noise ratio is now made possible because the surface coils are disposed and arranged in a quadrature detection coil structure.

While only one exemplary embodiment has been described in detail, those skilled in the art will recognize that many variations and modifications may be made in this exemplary embodiment while yet retaining many of the novel features and advantages of this invention. Accordingly, all such modifications and variations are to be included within the scope of the appended claims.

What is claimed is:

1. A quadrature detection magnetic resonance imaging RF coil comprising:
   a first RF coil structure extending axially and part-circumferentially about a volume to be imaged, said first coil having one pair of axially extending conductive legs circumferentially spaced apart by an angle $\beta$ which is substantially less than 180° and having ends respectively interconnected by circumferentially extending conductors so as to produce substantially non-symmetric, non-homogeneous, non-uniform RF fields within said volume;
   a second RF coil structure substantially the same as said first RF coil structure, said second RF coil structure also extending axially and part-circumferentially about said volume to be imaged,
   said second RF coil structure being rotationally offset by an angle $\alpha$ with respect to said first RF coil structure so as to achieve minimum RF inductive coupling between said first and second RF coil structures and to produce quadrature detection RF input/output to/from said first and second coils in spite of said non-symmetric, non-homogeneous, non-uniform RF field distribution.

2. A quadrature detection magnetic resonance imaging RF coil as in claim 1 further comprising:
   a capacitive coupling connected between predetermined portions of said first and second coils so as to increase the effective isolation therebetween.

3. A quadrature detection magnetic resonance imaging RF coil as in claim 1 wherein said first and second coil structures are mounted for adjustable rotational movements therebetween.

4. A quadrature detection magnetic resonance imaging RF coil as in claim 2 wherein said first and second coil structures are mounted for adjustable rotational movements therebetween.

5. A quadrature detection magnetic resonance imaging RF coil as in claim 1 wherein $\beta$ is approximately equal to 120° and $\alpha$ is approximately equal to 100°.

6. A quadrature detection magnetic resonance imaging RF coil as in claim 5 wherein each of said RF coil structures includes a non-conductive substrate formed to define an at least partial cylinder one of said substrates being mechanically encaptured by the other and slidably rotatable with respect thereto.

7. A QD MRI RF coil structure comprising:
   first and second co-located RF surface coils extending axially and part-circumferentially about a volume to be imaged but being rotationally offset so as to produce a pair of RF signals from said volume which are in quadrature phase while the RF fields produced thereby are non-symmetric, non-homogeneous and non-uniform within said volume.

8. A QD MRI RF coil structure as in claim 7 further comprising:
a capacitive coupling connected between predetermined portions of said first and second coils so as to increase the effective isolation therebetween.

9. A QD MRI RF coil structure as in claim 7 wherein said first and second coil structures are mounted for adjustable rotational movements therebetween.

10. A QD MRI RF coil structure as in claim 8 wherein said first and second coil structures are mounted for adjustable rotational movements therebetween.

11. A QD MRI RF coil structure as in claim 9 wherein each coil structure subtends approximately 120° of the circumference about said volume and wherein the coils are rotated with respect to one another by approximately 100°.

12. A QD MRI RF coil structure as in claim 11 wherein each of said RF coil structures includes a non-conductive substrate formed to define an at least partial cylinder one of said substrates being mechanically encaptured by the other and slidably rotatable with respect thereto.

* * * * *

UNITED STATES PATENT AND TRADEMARK OFFICE
CERTIFICATE OF CORRECTION

PATENT NO. : 4,707,664
DATED : 17 November 1987
INVENTOR(S) : John H. Fehn et al It is certified that error appears in the above-identified patent and that said Letters Patent is hereby corrected as shown below:

On the title page, item [54] and in column 1, lines 2-3, the title should correctly read as follows:

--QD MRI RF COIL USING NON-HOMOGENEOUS AND NON-UNIFORM RF FIELD DISTRIBUTION--.

Signed and Sealed this

Fifteenth Day of May, 1990

Attest:

HARRY F. MANBECK, JR.

Attesting Officer

Commissioner of Patents and Trademarks